(12) United States Patent
Kim et al.

(10) Patent No.: US 12,520,681 B2
(45) Date of Patent: Jan. 6, 2026

(54) DISPLAY APPARATUS

(71) Applicant: Samsung Display Co., Ltd., Yongin-si (KR)

(72) Inventors: Arong Kim, Yongin-si (KR); Jungsun Park, Yongin-si (KR); Hyejin Gwark, Yongin-si (KR); Heemin Park, Yongin-si (KR); Yeonhwa Lee, Yongin-si (KR); Kyuhwan Hwang, Yongin-si (KR); Jaeik Kim, Yongin-si (KR); Joongu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 538 days.

(21) Appl. No.: 17/951,128

(22) Filed: Sep. 23, 2022

(65) Prior Publication Data

US 2023/0135268 A1    May 4, 2023

(30) Foreign Application Priority Data

Nov. 1, 2021  (KR) .......................... 10-2021-0148125

(51) Int. Cl.
*H01L 21/78* (2006.01)
*H10K 50/824* (2023.01)
*H10K 59/131* (2023.01)

(52) U.S. Cl.
CPC ......... *H10K 59/131* (2023.02); *H10K 50/824* (2023.02)

(58) Field of Classification Search
CPC .. H10K 59/131; H10K 50/814; H10K 50/824; H10K 59/122; H10K 71/00; H10K 59/1201; H10K 59/80516; H10K 59/80522; H10K 59/32; H10K 59/123
USPC ........................................................ 257/40
See application file for complete search history.

(56) References Cited

U.S. PATENT DOCUMENTS

| | | | |
|---|---|---|---|
| 8,227,803 B2 * | 7/2012 | Park ..................... | H10K 59/131 |
| | | | 257/E39.007 |
| 8,354,980 B2 | 1/2013 | Kwak | |
| 9,093,669 B2 * | 7/2015 | Park ..................... | H10K 59/353 |
| 9,748,318 B2 * | 8/2017 | Shim ................ | H10K 59/80522 |

(Continued)

FOREIGN PATENT DOCUMENTS

| | | |
|---|---|---|
| JP | 2008-135325 | 6/2008 |
| KR | 10-2016-0006110 | 1/2016 |

(Continued)

*Primary Examiner* — Vu A Vu
(74) *Attorney, Agent, or Firm* — Lerner David LLP

(57) ABSTRACT

A display apparatus includes an auxiliary line that includes a main sublayer, a lower sublayer arranged under the main sublayer, and an upper sublayer arranged over the main sublayer, a partition wall adjacent to the auxiliary line and that includes an opening corresponding to a side surface of the auxiliary line, a first electrode adjacent to the auxiliary line, a second electrode arranged over the first electrode and the auxiliary line, and an intermediate layer arranged between the first electrode and the second electrode and that includes an emission layer, wherein the upper sublayer of the auxiliary line includes a tip protruding in a lateral direction from a point where a side surface and an upper surface of the main sublayer meet each other, an upper end of the partition wall is spaced apart from the tip of the auxiliary line, and the second electrode contacts the auxiliary line.

18 Claims, 9 Drawing Sheets

(56) References Cited

U.S. PATENT DOCUMENTS

| | | | |
|---|---|---|---|
| 9,806,279 B2 | 10/2017 | Im et al. | |
| 9,859,520 B2 | 1/2018 | Kim | |
| 9,947,733 B2 * | 4/2018 | Jang | H10K 50/824 |
| 10,177,206 B2 * | 1/2019 | Jung | H10K 50/824 |
| 10,181,573 B2 * | 1/2019 | Im | H10K 50/824 |
| 10,388,905 B2 * | 8/2019 | Choi | H10K 50/824 |
| 10,686,022 B2 | 6/2020 | Lee et al. | |
| 10,707,293 B2 * | 7/2020 | Takechi | H10K 50/828 |
| 10,756,292 B2 | 8/2020 | Tang et al. | |
| 11,489,136 B2 * | 11/2022 | Wang | H10K 59/122 |
| 11,563,074 B2 | 1/2023 | Cho et al. | |
| 11,574,985 B2 * | 2/2023 | Koh | H10K 59/131 |
| 11,985,840 B2 * | 5/2024 | Liu | H10K 50/824 |
| 11,997,864 B2 * | 5/2024 | Wang | H10K 59/122 |
| 12,022,676 B2 * | 6/2024 | Lee | H10K 50/824 |
| 2016/0013438 A1 | 1/2016 | Im et al. | |
| 2018/0190944 A1 | 7/2018 | Lee et al. | |
| 2020/0135838 A1 | 4/2020 | Han et al. | |
| 2021/0202655 A1 | 7/2021 | Cho et al. | |

FOREIGN PATENT DOCUMENTS

| | | |
|---|---|---|
| KR | 10-2016-0062646 | 6/2016 |
| KR | 10-2019-0060473 | 6/2019 |
| KR | 20210086869 A | 7/2021 |

* cited by examiner

DISPLAY APPARATUS

CROSS-REFERENCE TO RELATED APPLICATIONS

This application claims priority from and the benefit of Korean Patent Application No. 10-2021-0148125, filed on Nov. 1, 2021, which is hereby incorporated by reference for all purposes as if fully set forth herein.

BACKGROUND

Field

Embodiments of the invention relate generally to display apparatuses.

Discussion of the Background

Generally, in a display apparatus such as an organic light emitting display apparatus, transistors are arranged in a display area to control the luminance of light emitting diodes. The transistors control to emit light with a certain color from the corresponding light emitting diode by using the received data signal, driving voltage, and common voltage.

One of the electrodes of the light emitting diode may receive a certain voltage through the transistor, and another one may receive a voltage through an auxiliary line.

The above information disclosed in this Background section is only for understanding of the background of the inventive concepts, and, therefore, it may contain information that does not constitute prior art.

SUMMARY

One or more inventive concepts consistent with embodiments described hereinbelow include a display apparatus capable of displaying a high-quality image. The problems solved by way of the embodiments are merely examples and the scope of the embodiments described herein is not limited thereto.

Additional features of the inventive concepts will be set forth in the description that follows, and in part will be apparent from the description, or may be learned by practice of the inventive concepts.

According to one or more embodiments, a display apparatus includes an auxiliary line that includes a main sublayer, a lower sublayer arranged under the main sublayer, and an upper sublayer arranged over the main sublayer, a partition wall adjacent to the auxiliary line and that includes an opening corresponding to a side surface of the auxiliary line, a first electrode adjacent to the auxiliary line, a second electrode arranged over the first electrode and the auxiliary line, and an intermediate layer arranged between the first electrode and the second electrode and that includes an emission layer, wherein the upper sublayer of the auxiliary line includes a tip protruding in a lateral direction from a point where a side surface and an upper surface of the main sublayer meet each other, an upper end of the partition wall is spaced apart from the tip of the auxiliary line, and the second electrode contacts the auxiliary line.

In an embodiment, the display apparatus may further include a first insulating layer including an opening having a greater width than the auxiliary line, wherein a portion of the auxiliary line and the partition wall may be located in the opening of the first insulating layer.

In an embodiment, a thickness of the partition wall may be equal to or less than 0.75 times a thickness of the auxiliary line.

In an embodiment, the second electrode may include a first portion contacting the auxiliary line and a second portion located opposite the first portion with respect to the partition wall, and the first portion and the second portion may be separated from each other around the partition wall and integrally connected to each other through the opening of the partition wall.

In an embodiment, the second electrode may directly contact at least one of a side surface of the main sublayer of the auxiliary line and an upper surface of the lower sublayer of the auxiliary line.

In an embodiment, a thickness of the main sublayer may be greater than at least one of a thickness of the upper sublayer and a thickness of the lower sublayer.

In an embodiment, the main sublayer may include at least one of copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

In an embodiment, at least one of the upper sublayer and the lower sublayer may include at least one of indium tin oxide (ITO), titanium (Ti), molybdenum (Mo), and tungsten (W).

In an embodiment, the intermediate layer may be arranged over the first electrode and the auxiliary line, wherein the intermediate layer may include a first portion on an upper surface of the auxiliary line, a second portion arranged on a side of the auxiliary line with respect to the partition wall, and a third portion located opposite the second portion with respect to the partition wall.

In an embodiment, the first portion and the second portion of the intermediate layer may be separated from each other around the partition wall and integrally connected to each other through the opening of the partition wall.

According to one or more embodiments, a method of manufacturing a display apparatus includes forming an auxiliary line including a main sublayer, a lower sublayer under the main sublayer, and an upper sublayer over the main sublayer, forming a partition wall adjacent to the auxiliary line and that includes an opening corresponding to a side surface of the auxiliary line, forming a first electrode adjacent to the auxiliary line, forming an intermediate layer that overlaps the first electrode and that includes an emission layer, and forming a second electrode that overlaps the intermediate layer and the auxiliary line, wherein in the forming of the partition wall, an upper end of the partition wall is spaced apart from a tip of the upper sublayer that protrudes in a lateral direction from a point where a side surface and an upper surface of the main sublayer meet each other, and in the forming of the second electrode, the second electrode contacts the auxiliary line under the tip of the upper sublayer.

In an embodiment, the forming of the partition wall may be performed simultaneously with the forming of the auxiliary line.

In an embodiment, the forming of the partition wall may be performed by dry etching.

In an embodiment, the forming of the second electrode may be performed by thermal evaporation or sputtering.

In an embodiment, a thickness of the partition wall may be equal to or less than 0.75 times a thickness of the auxiliary line.

In an embodiment, the second electrode may include a first portion contacting the auxiliary line and a second portion located opposite the first portion with respect to the partition wall, and the first portion and the second portion may be separated from each other around the partition wall and integrally connected to each other through the opening of the partition wall.

In an embodiment, the second electrode may directly contact at least one of a side surface of the main sublayer of the auxiliary line and an upper surface of the lower sublayer of the auxiliary line.

In an embodiment, a thickness of the main sublayer may be greater than at least one of a thickness of the upper sublayer and a thickness of the lower sublayer.

In an embodiment, the main sublayer may include at least one of copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

In an embodiment, at least one of the upper sublayer and the lower sublayer may include at least one of indium tin oxide (ITO), titanium (Ti), molybdenum (Mo), and tungsten (W).

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
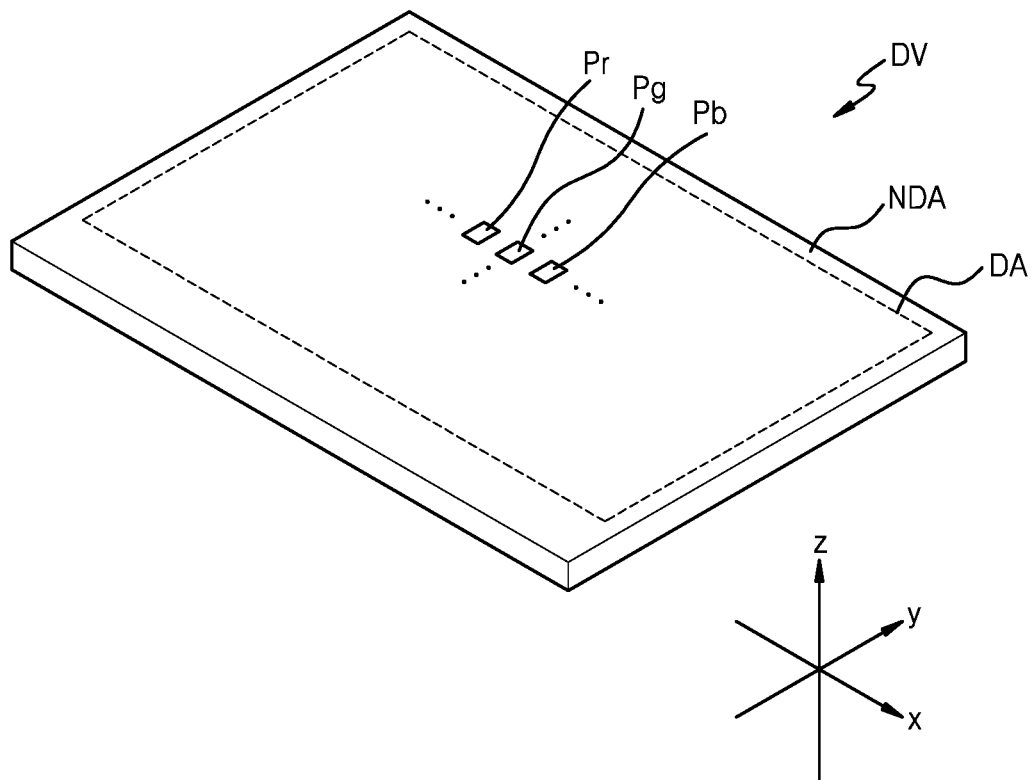
FIG. 1 is a perspective view schematically illustrating a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to that this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display apparatus according to an embodiment that is constructed according to principles of the invention.

Referring to FIG. 1, a display apparatus DV may include a display area DA and a non-display area NDA outside the display area DA. The display apparatus DV may provide an image in the display area DA through an array of a plurality of pixels two-dimensionally arranged on the x-y plane. The plurality of pixels may include a first pixel, a second pixel, and a third pixel, and hereinafter, for convenience of description, a case where the first pixel is a red pixel Pr, the second pixel is a green pixel Pg, and a third pixel is a blue pixel Pb will be described.

The red pixel Pr, the green pixel Pg, and the blue pixel Pb may be areas capable of respectively emitting red, green, and blue light, and the display apparatus DV may provide an image by using the light emitted from the pixels.

The non-display area NDA may be an area not providing an image and may entirely surround the display area DA. A driver or a main voltage line for providing an electrical signal or power to pixel circuits may be arranged in the non-display area NDA. The non-display area NDA may include a pad that is an area to which an electronic device or a printed circuit board may be electrically connected.

The display area DA may have a polygonal shape including a tetragonal shape as illustrated in FIG. 1. For example, the display area DA may have a rectangular shape in which the horizontal length is greater than the vertical length, may have a rectangular shape in which the horizontal length is less than the vertical length, or may have a square shape. Alternatively, the display area DA may have various shapes such as an elliptical shape or a circular shape.

Figure 2:
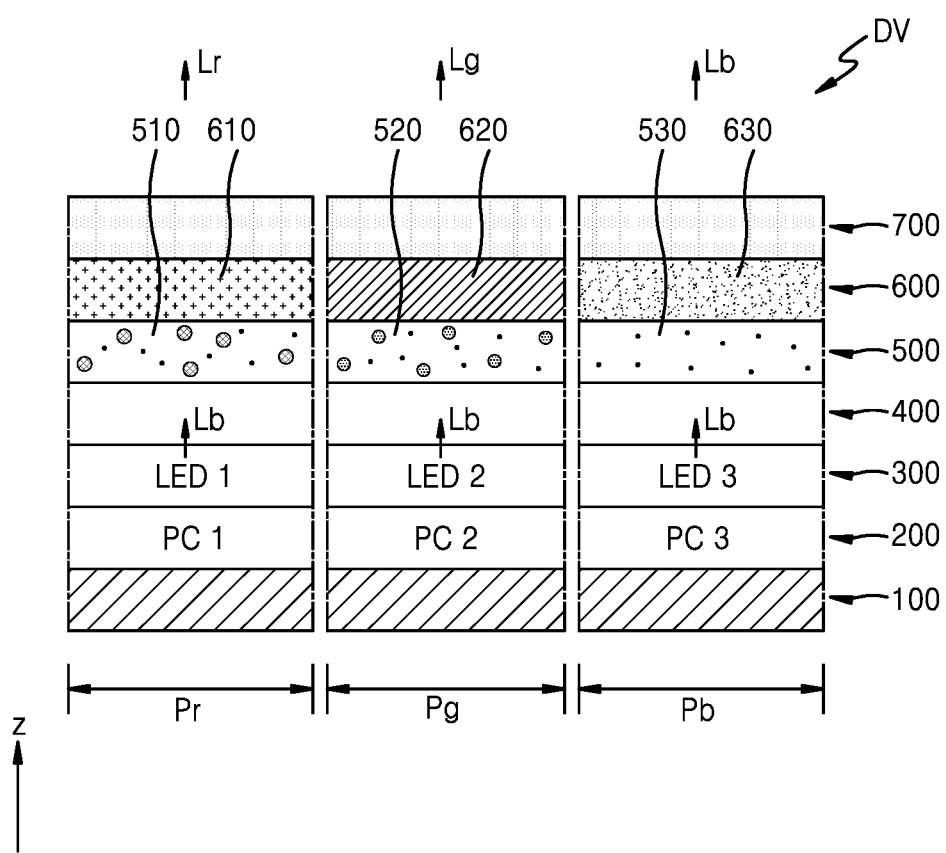
FIG. 2 is a cross-sectional view schematically illustrating subpixels of a display apparatus according to an embodiment.

FIG. 2 is a cross-sectional view schematically illustrating pixels of a display apparatus according to an embodiment.

Referring to FIG. 2, the display apparatus DV may include a circuit layer 200 over a substrate 100. The circuit layer 200 may include first to third pixel circuits PC1, PC2, and PC3, and the first to third pixel circuits PC1, PC2, and PC3 may be respectively electrically connected to first to third light emitting diodes LED1, LED2, and LED3 of a light emitting diode layer 300.

The first to third light emitting diodes LED1, LED2, and LED3 may include an organic light emitting diode including an organic material. In another embodiment, the first to third light emitting diodes LED1, LED2, and LED3 may include an inorganic light emitting diode including an inorganic material. The inorganic light emitting diode may include a PN junction diode including inorganic semiconductor-based materials. When a voltage is applied to a PN junction diode in a forward direction, holes and electrons may be injected thereinto and energy generated by recombination of the holes and electrons may be converted into light energy to emit light of a certain color. The inorganic light emitting diode may have a width of several to several hundred micrometers or several to several hundred nanometers. In some embodiments, a light emitting diode LED may be a light emitting diode including quantum dots. As illustrated above, an emission layer of the light emitting diode LED may include an organic material, may include an inorganic material, may include quantum dots, may include an organic material and quantum dots, or may include an inorganic material and quantum dots.

The first to third light emitting diodes LED1, LED2, and LED3 may emit light of the same color. For example, the light (e.g., blue light Lb) emitted from the first to third light emitting diodes LED1, LED2, and LED3 may pass a color conversion-transmission layer 500 through an encapsulation layer 400 over the light emitting diode layer 300.

The color conversion-transmission layer 500 may include optical units that transmit the light (e.g., blue light Lb) emitted from the light emitting diode layer 300 with or without converting the color of the emitted light. For example, the color conversion-transmission layer 500 may include color conversion units that convert the light (e.g., blue light Lb) emitted from the light emitting diode layer 300 into light of another color and a transmission unit that transmits the light (e.g., blue light Lb) emitted from the light emitting diode layer 300 without converting the color of the emitted light. The color conversion-transmission layer 500 may include a first color conversion unit 510 corresponding to a red pixel Pr, a second color conversion unit 520 corresponding to a green pixel Pg, and a transmission unit 530 corresponding to a blue pixel Pb. The first color conversion unit 510 may convert blue light Lb into red light Lr, and the second color conversion unit 520 may convert blue light Lb into green light Lg. The transmission unit 530 may transmit blue light Lb without conversion.

A color layer 600 may be arranged over the color conversion-transmission layer 500. The color layer 600 may include first to third color filters 610, 620, and 630 of different colors. For example, the first color filter 610 may be a red color filter, the second color filter 620 may be a green color filter, and the third color filter 630 may be a blue color filter.

The color purity of the color-converted light and the transmitted light by the color conversion-transmission layer 500 may be improved while passing through the first to third color filters 610, 620, and 630 respectively. Also, the color layer 600 may prevent or minimize external light (e.g., light incident toward the display apparatus DV from the outside of the display apparatus DV) from being reflected and recognized by the user.

A transparent base layer 700 may be included over the color layer 600. The transparent base layer 700 may include glass or a transparent organic material. For example, the transparent base layer 700 may include a transparent organic material such as an acrylic resin.

In an embodiment, the transparent base layer 700 may be a type of substrate, and the color layer 600 and the color conversion-transmission layer 500 may be formed on the transparent base layer 700 and then integrated such that the color conversion-transmission layer 500 may face the encapsulation layer 400.

In another embodiment, the color conversion-transmission layer 500 and the color layer 600 may be sequentially formed on the encapsulation layer 400 and then the transparent base layer 700 may be directly applied and cured on the color layer 600. In some embodiments, another optical film such as an anti-reflection (AR) film may be arranged on the transparent base layer 700.

The display apparatus DV having the above structure may include an electronic apparatus capable of displaying a moving image or a still image, such as a television, a billboard, a cinema screen, a monitor, a tablet PC, or a notebook computer.

Figure 3:
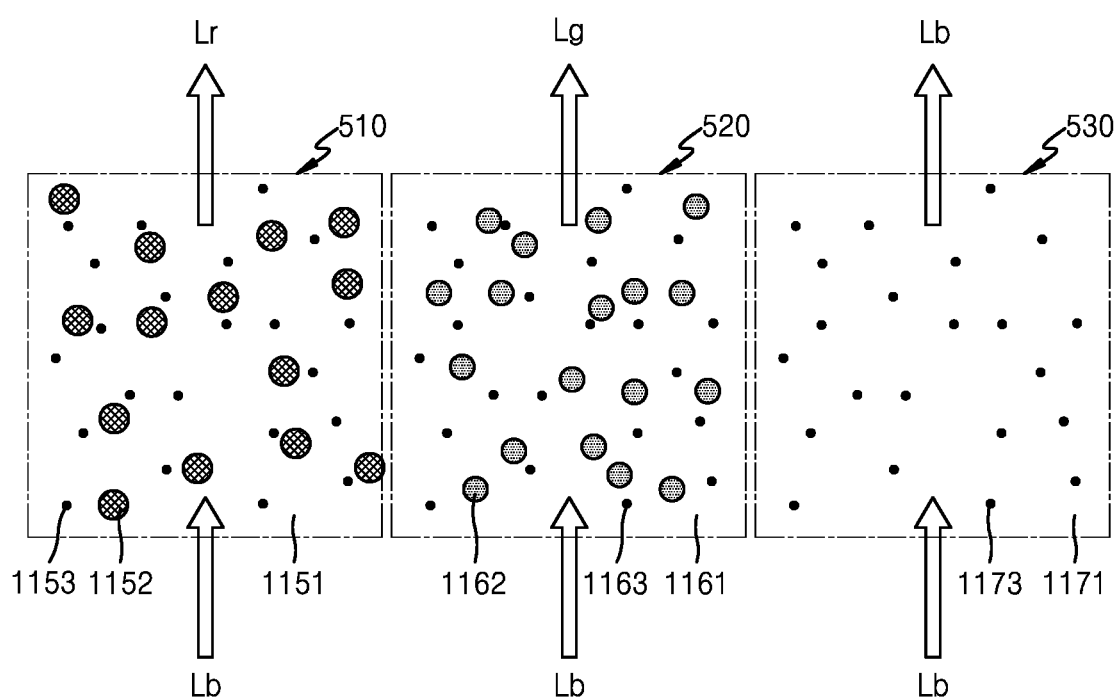
FIG. 3 illustrates optical portions of a color conversion-transmission layer of FIG. 2.

FIG. 3 illustrates optical portions of a color conversion-transmission layer of FIG. 2.

Referring to FIG. 3, the first color conversion unit 510 may convert incident blue light Lb into red light Lr. As illustrated in FIG. 3, the first color conversion unit 510 may include a first photosensitive polymer 1151 and first quantum dots 1152 and first scattering particles 1153 dispersed in the first photosensitive polymer 1151.

The first quantum dots 1152 may be excited by blue light Lb to isotropically emit red light Lr having a longer wavelength than blue light. The first photosensitive polymer 1151 may include an organic material having light transmittance. The first scattering particles 1153 may scatter blue light Lb, which has not been absorbed by the first quantum dots 1152, to excite more first quantum dots 1152, thereby increasing the color conversion efficiency. The first scattering particles 1153 may include, for example, titanium oxide (TiO2), metal particles, or the like. The first quantum dots 1152 may be selected from a Group II-VI compound, a Group III-V compound, a Group IV-VI compound, a Group IV element, a Group IV compound, and any combination thereof.

The second color conversion unit 520 may convert incident blue light Lb into green light Lg. As illustrated in FIG. 3, the second color conversion unit 520 may include a second photosensitive polymer 1161 and second quantum dots 1162 and second scattering particles 1163 dispersed in the second photosensitive polymer 1161.

The second quantum dots 1162 may be excited by blue light Lb to isotropically emit green light Lg having a longer wavelength than blue light. The second photosensitive polymer 1161 may include an organic material having light transmittance.

The second scattering particles 1163 may scatter blue light Lb, which has not been absorbed by the second quantum dots 1162, to excite more second quantum dots 1162, thereby increasing the color conversion efficiency. The second scattering particles 1163 may include, for example, titanium oxide (TiO2), metal particles, or the like. The second quantum dots 1162 may be selected from a Group II-VI compound, a Group III-V compound, a Group IV-VI compound, a group IV element, a Group IV compound, and any combination thereof.

In some embodiments, the first quantum dots 1152 and the second quantum dots 1162 may be the same material. In this case, the size of the first quantum dots 1152 may be greater than the size of the second quantum dots 1162.

The transmission unit 530 may transmit blue light Lb without converting blue light Lb incident on the transmission unit 530. As illustrated in FIG. 3, the transmission unit 530 may include a third photosensitive polymer 1171 in which third scattering particles 1173 are dispersed. The third photosensitive polymer 1171 may include, for example, an organic material having light transmittance, such as a silicon resin or an epoxy resin, and may include the same material as the first and second photosensitive polymers 1151 and 1161. The third scattering particles 1173 may scatter and emit blue light Lb and may include the same material as the first and second scattering particles 1153 and 1163.

Figure 4:
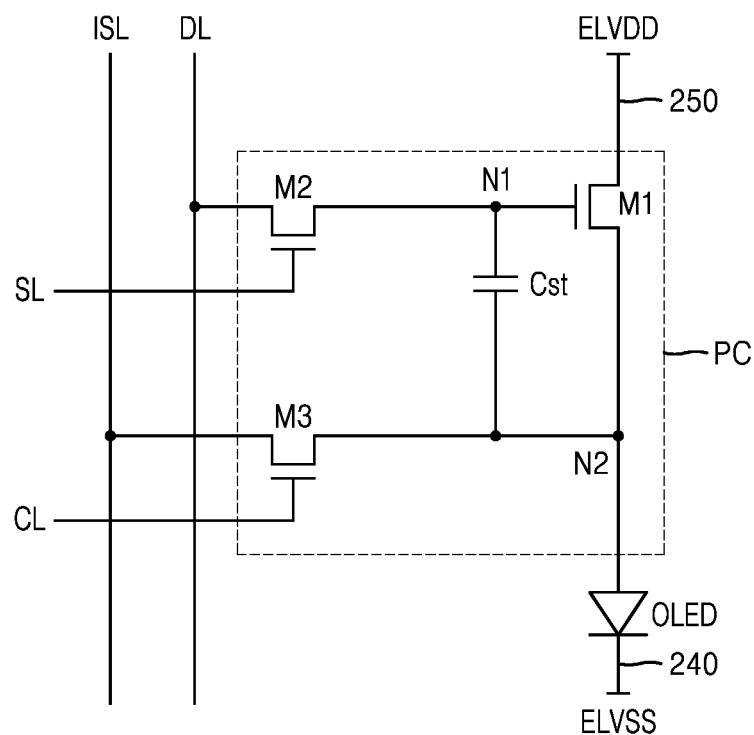
FIG. 4 is an equivalent circuit diagram illustrating a light emitting diode and a subpixel circuit electrically connected to the light emitting diode, which are included in a display apparatus according to an embodiment.

FIG. 4 is an equivalent circuit diagram illustrating a light emitting diode and a pixel circuit electrically connected to the light emitting diode, which are included in a display apparatus according to an embodiment. A pixel circuit PC illustrated in FIG. 4 may correspond to each of the first to third pixel circuits PC1, PC2, and PC3 described above with reference to FIG. 2, and a light emitting diode LED of FIG. 4 may correspond to the first to third light emitting diodes LED1, LED2, and LED3 described above with reference to FIG. 2.

Referring to FIG. 4, a first electrode (e.g., anode) of the light emitting diode, for example, the light emitting diode LED, may be connected to the pixel circuit PC, and a second electrode (e.g., cathode) of the light emitting diode LED may be connected to an auxiliary line 240 for providing a common voltage ELVSS. The light emitting diode LED may emit light with a luminance corresponding to the amount of a current supplied from the pixel circuit PC.

The light emitting diode LED of FIG. 4 may correspond to each of the first to third light emitting diodes LED1, LED2, and LED3 illustrated in FIG. 2, and the pixel circuit PC of FIG. 4 may correspond to each of the first to third pixel circuits PC1, PC2, and PC3 illustrated in FIG. 2.

The pixel circuit PC may control the amount of a current flowing from a driving voltage ELVDD via the light emitting diode LED to the common voltage ELVSS in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer including an oxide semiconductor or may be a silicon semiconductor transistor including a semiconductor layer including polysilicon. Depending on the type of the transistor, the first electrode may be one of a source electrode and a drain electrode, and the second electrode may be the other one of the source electrode and the drain electrode.

The first electrode of the first transistor M1 may be connected to a driving voltage line 250 for supplying the driving voltage ELVDD, and the second electrode thereof may be connected to the first electrode of the light emitting diode LED. The gate electrode of the first transistor M1 may be connected to a first node N1. The first transistor M1 may control the amount of a current flowing from the driving voltage ELVDD through the light emitting diode LED in response to a voltage of the first node N1.

The second transistor M2 may be a switching transistor. The first electrode of the second transistor M2 may be connected to a data line DL, and the second electrode thereof may be connected to the first node N1. The gate electrode of the second transistor M2 may be connected to a scan line SL. When a scan signal is supplied to the scan line SL, the second transistor M2 may be turned on to electrically connect the data line DL to the first node N1.

The third transistor M3 may be an initialization transistor and/or a sensing transistor. The first electrode of the third transistor M3 may be connected to a second node N2, and the second electrode thereof may be connected to a sensing line ISL. The gate electrode of the third transistor M3 may be connected to a control line CL.

The storage capacitor Cst may be connected between the first node N1 and the second node N2. For example, the first capacitor electrode of the storage capacitor Cst may be connected to the gate electrode of the first transistor M1, and the second capacitor electrode of the storage capacitor Cst may be connected to the first electrode of the light emitting diode LED.

In FIG. 4, the first transistor M1, the second transistor M2, and the third transistor M3 are illustrated as NMOS transistors; however, the embodiment is not limited thereto. For example, at least one of the first transistor M1, the second transistor M2, and the third transistor M3 may be formed as a PMOS transistor.

Although three transistors are illustrated in FIG. 4, the embodiment is not limited thereto. The pixel circuit PC may include four or more transistors.

Figure 5:
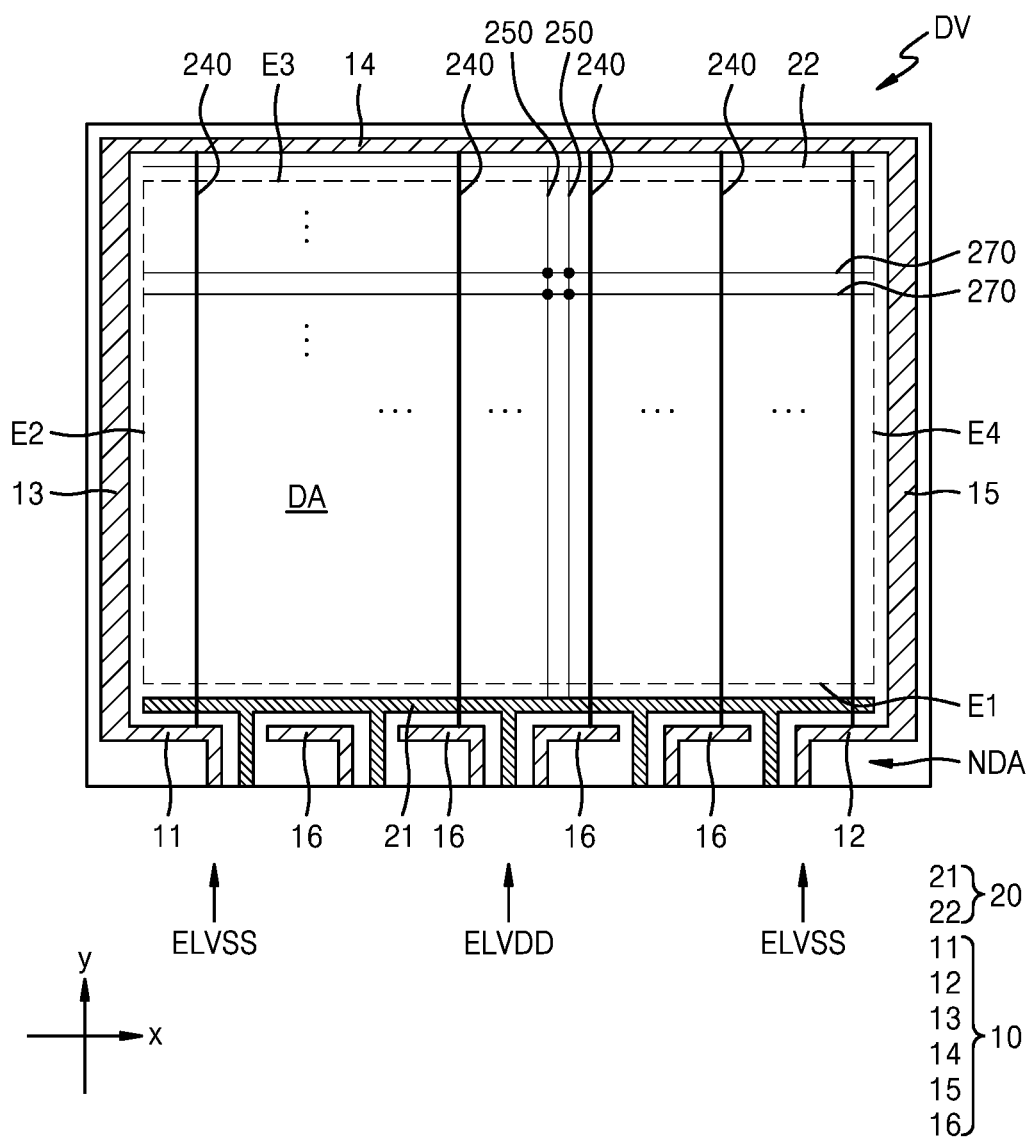
FIG. 5 is a plan view illustrating a common voltage supply line and a driving voltage supply line of a display apparatus according to an embodiment.

FIG. 5 is a plan view illustrating a common voltage supply line and a driving voltage supply line of a display apparatus according to an embodiment.

Referring to FIG. 5, the display apparatus DV may include a common voltage supply line 10 for supplying the common voltage ELVSS to the pixel circuit described above with reference to FIG. 4 and a driving voltage supply line 20 for supplying the driving voltage ELVDD to the second electrode of the light emitting diode. The common voltage supply line 10 and the driving voltage supply line 20 may be arranged in the non-display area NDA.

The shape of the display apparatus DV may be substantially the same as the shape of the substrate 100. For example, the substrate 100 may be referred to as including the display area DA and the non-display area NDA outside the display area DA, and hereinafter, for convenience of description, the substrate 100 will be described as including the display area DA and the non-display area NDA outside the display area DA.

The common voltage supply line 10 may include a first common voltage input unit 11 and a second common voltage input unit 12 arranged adjacent to a first edge E1 of the display area DA. The first common voltage input unit 11 and the second common voltage input unit 12 may be spaced apart from each other in the x direction and may be integrally connected through first to third extension portions 13, 14, and 15 arranged adjacent to second to fourth edges E2, E3, and E4 of the display area DA.

At least one third common voltage input unit 16 may be arranged between the first common voltage input unit 11 and the second common voltage input unit 12, and according to an embodiment, FIG. 5 illustrates four third common voltage input units 16.

The common voltage supply line 10 may be electrically connected to auxiliary lines 240 passing the display area DA. Each of the auxiliary lines 240 may extend, for example, in the y direction as illustrated in FIG. 5. At least one auxiliary line 240 may extend across the display area DA in the y direction and may be electrically connected to the first common voltage input unit 11 and a portion of the second extension portion 14 facing the first common voltage input unit 11. At least one other auxiliary line 240 may extend across the display area DA in the y direction and may be electrically connected to the second common voltage input unit 12 and a portion of the second extension portion 14 facing the second common voltage input unit 12. Similarly, at least one other auxiliary line 240 may extend across the display area DA in the y direction and may be electrically connected to the third common voltage input unit 16 and a portion of the second extension portion 14 facing the third common voltage input unit 16.

Compared to when the common voltage supply line 10 includes only the first common voltage input unit 11 and the second common voltage input unit 12, when the common voltage supply line 10 includes the third common voltage input unit 16 arranged between the first common voltage input unit 11 and the second common voltage input unit 12, the current density may be reduced and overheating may be suppressed when the current supplied through the common voltage supply line 10 is applied.

The driving voltage supply line 20 may be located in the non-display area NDA and may include a driving voltage supply unit 21 adjacent to the first edge E1 of the display area DA and a counterpart 22 extending along a third edge E3 of the display area DA. The driving voltage supply unit 21 and the counterpart 22 may be arranged on both sides of the display area DA with the display area DA therebetween.

The driving voltage supply line 20 may be electrically connected to driving voltage lines 250 intersecting the display area DA. Each of the driving voltage lines 250 may extend in the y direction while being electrically connected to the driving voltage supply unit 21. In some embodiments, the driving voltage lines 250 may be electrically connected to horizontal driving voltage lines 270 extending in the x direction to intersect the driving voltage lines 250. The driving voltage line 250 and the horizontal driving voltage line 270 may be arranged on different layers and may be electrically connected through a contact hole penetrating at least one insulating layer arranged therebetween.

Figure 6:
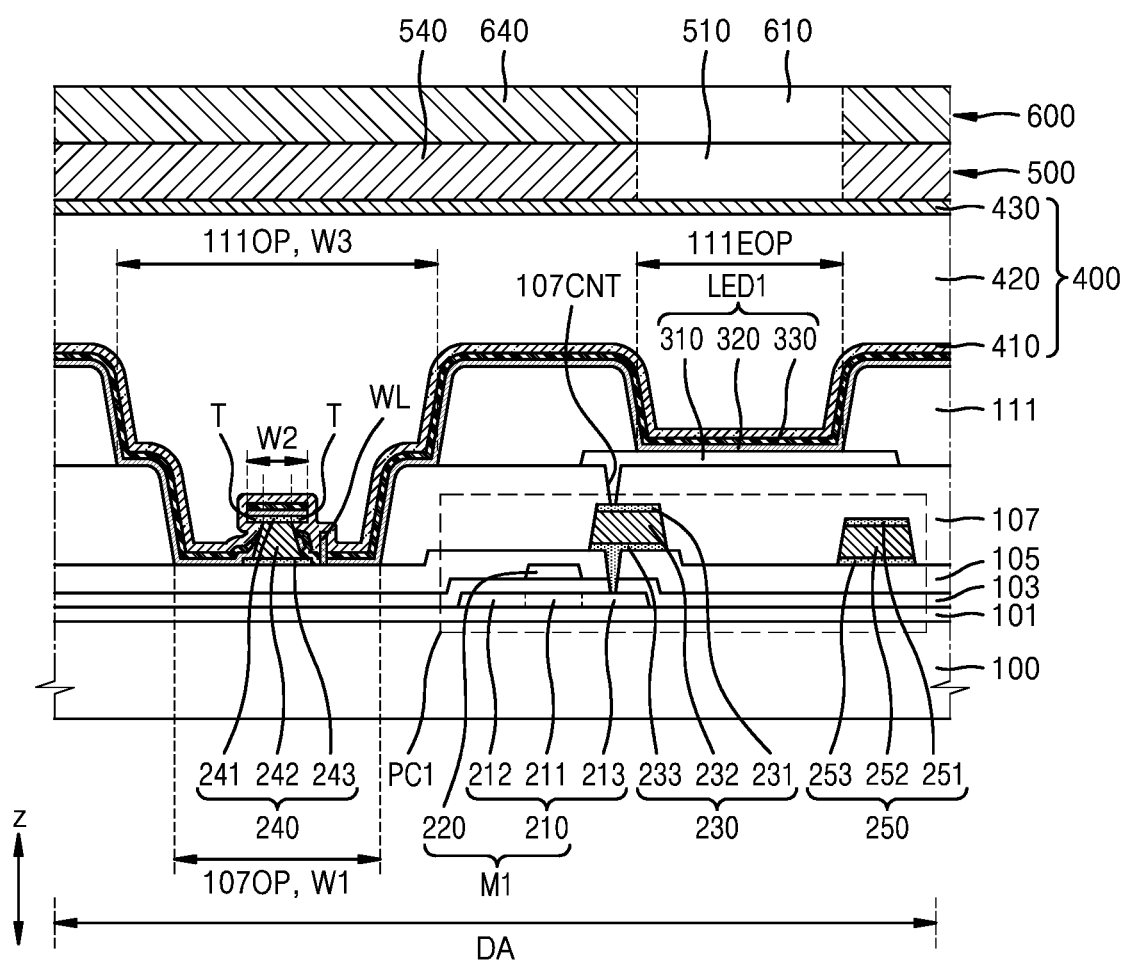
FIG. 6 is a cross-sectional view illustrating a portion of a display apparatus according to an embodiment.

FIG. 6 is a cross-sectional view illustrating a portion of a display apparatus according to an embodiment.

Referring to FIG. 6, at least one of the auxiliary lines 240 described above with reference to FIG. 5 may be electrically connected to the second electrode of the light emitting diode in the display area DA.

Although FIG. 6 illustrates a first light emitting diode LED1 among a plurality of light emitting diodes arranged in a display apparatus, the second and third light emitting diodes LED2 and LED3 described above with reference to FIG. 2 may also have the same structure as the first light emitting diode of FIG. 6.

Referring to FIG. 6, a first light emitting diode LED1 may be arranged over a substrate 100. A first subpixel circuit PC1 electrically connected to the first light emitting diode LED1 may be arranged between the substrate 100 and the first light emitting diode LED1. The first subpixel circuit PC1 may include a plurality of transistors and a storage capacitor as described above with reference to FIG. 4. In this regard, FIG. 6 illustrates a first transistor M1.

The substrate 100 may include a glass material or a polymer resin. For example, the polymer resin may include polyether sulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may have flexibility. For example, the display apparatus including the substrate 100 having flexibility may change in shape such as being curved, bendable, rollable, or foldable.

A buffer layer 101 may be arranged on the substrate 100, may prevent impurities from penetrating from the substrate 100 toward the transistor, for example, the first transistor M1, and may provide a flat surface on the substrate 100. The buffer layer 101 may include an inorganic insulating material such as silicon oxide, silicon nitride, and/or silicon oxynitride.

A driving semiconductor layer 210 of the first transistor M1 may be arranged on the buffer layer 101. The driving semiconductor layer 210 may include an oxide semiconductor. The oxide semiconductor may include indium gallium zinc oxide (IGZO), zinc tin oxide (ZTO), indium zinc oxide (IZO), or the like. In another embodiment, the driving semiconductor layer 210 may include polysilicon, may include amorphous silicon, or may include an organic semiconductor or the like. The driving semiconductor layer 210 may include a channel area 211 that overlaps a driving gate electrode 220 and a first area 212 and a second area 213 that are arranged on both sides of the channel area 211 and are doped or become conductive. One of the first area 212 and the second area 213 may be a source area, and the other one may be a drain area.

The driving gate electrode 220 may overlap the channel area 211 of the driving semiconductor layer 210 with a gate insulating layer 103 therebetween. The driving gate electrode 220 may include a conductive material including molybdenum (Mo), aluminum (Al), copper (Cu), titanium (Ti), or the like and may include a single layer or multiple layers including the above material. The gate insulating layer 103 may include an inorganic insulating material such as silicon oxide, silicon nitride, and/or silicon oxynitride.

A connection electrode 230 may be arranged on the interlayer insulating layer 105 and may be connected to any one of the first area 212 and the second area 213 of the driving semiconductor layer 210. In this regard, FIG. 6 illustrates that the connection electrode 230 is connected to the second area 213. When the second area 213 is a source (or drain) area, the connection electrode 230 may correspond to a source (or drain) electrode. The interlayer insulating layer 105 may include an inorganic insulating material such as silicon oxide or silicon oxynitride. The interlayer insulating layer 105 may be formed as a single layer or multiple layers including the above material. For example, the interlayer insulating layer 105 may have a multilayer structure including a silicon nitride layer and a silicon oxide layer thereunder.

Each of the gate insulating layer 103 and the interlayer insulating layer 105 may be an insulating layer including an inorganic insulating material may be formed through chemical vapor deposition (CVD) or atomic layer deposition (ALD).

A driving voltage line 250 may be arranged on the interlayer insulating layer 105 and may be formed in the same process as the connection electrode 230. The connection electrode 230 and the driving voltage line 250 may be formed as a plurality of sublayers. For example, the connection electrode 230 may include a first layer 231, a second layer 232 under the first layer 231, and a third layer 233 under the second layer 232. Similarly, the driving voltage line 250 may include a first layer 251, a second layer 252 under the first layer 251, and a third layer 253 under the second layer 252.

Each of the first layer 231 of the connection electrode 230 and the first layer 251 of the driving voltage line 250 may be a metal layer including a metal such as titanium (Ti), molybdenum (Mo), and/or tungsten (W) or may include a transparent conductive oxide (TCO) such as an indium tin oxide (ITO), a gallium zinc oxide (GZO), and/or an indium zinc oxide (IZO).

Each of the second layer 232 of the connection electrode 230 and the second layer 252 of the driving voltage line 250 may include copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and/or molybdenum (Mo).

Each of the third layer 233 of the connection electrode 230 and the third layer 253 of the driving voltage line 250 may include a transparent conductive oxide (TCO) such as an indium tin oxide (ITO) or may include a metal such as titanium (Ti), molybdenum (Mo), and/or tungsten (W).

An auxiliary line 240 arranged in the display area DA may be arranged adjacent to the first subpixel circuit PC1. The auxiliary line 240 may be arranged on the same layer as the connection electrode 230 and/or the driving voltage line 250. In this regard, FIG. 6 illustrates that the auxiliary line 240 is arranged on the interlayer insulating layer 105. In another embodiment, the auxiliary line 240 may be arranged on the same layer as a first electrode 310 of the first light emitting diode LED1.

The auxiliary line 240 may have a stack structure including a plurality of conductive layers. The auxiliary line 240 may include a main sublayer 242, an upper sublayer 241 over the main sublayer 242, and a lower sublayer 243 under the main sublayer 242.

In consideration of conductivity or the like, the main sublayer 242 may include copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and/or molybdenum (Mo). The main sublayer 242 may have a single-layer or multiple-layer structure including the above material. In some embodiments, the main sublayer 242 may be a single layer including copper (Cu) or may be a single layer including aluminum (Al).

The lower sublayer 243 may include a different material than the main sublayer 242. The lower sublayer 243 may be selected in consideration of conductivity, adhesion, and the like. For example, the lower sublayer 243 may be a metal layer including a metal such as titanium (Ti), molybdenum (Mo), and/or tungsten (W) or may include a transparent conductive oxide (TCO) such as an indium tin oxide (ITO), a gallium zinc oxide (GZO), and/or an indium zinc oxide (IZO), and the above transparent conductive oxide may be amorphous or crystalline.

The upper sublayer 241 may be arranged on the main sublayer 242 and may include a different material than the main sublayer 242. The upper sublayer 241 may prevent the main sublayer 242 from being damaged during the manufacturing process of the display apparatus. The upper sublayer 241 may include a transparent conductive oxide (TCO) such as an indium tin oxide (ITO). The upper sublayer 241 may include a metal such as titanium (Ti), molybdenum (Mo), and/or tungsten (W). Alternatively, the upper sublayer 241 may have a multilayer structure including the above metal layer and a transparent conductive oxide layer. In some embodiments, the upper sublayer 241 may include the same material as the lower sublayer 243; however, in other embodiments, the upper sublayer 241 may include a different material than the lower sublayer 243.

The auxiliary line 240 may include the same material as the connection electrode 230 and/or the driving voltage line 250 arranged on the same layer. For example, the first layer 231, the second layer 232, and the third layer 233 of the connection electrode 230 may include the same material as the upper sublayer 241, the main sublayer 242, and the lower sublayer 243 of the auxiliary line 240 respectively. Similarly, the first layer 251, the second layer 252, and the third layer 253 of the driving voltage line 250 may include the same material as the upper sublayer 241, the main sublayer 242, and the lower sublayer 243 of the auxiliary line 240 respectively.

A partition wall WL may be arranged on the same layer as the auxiliary line 240. FIG. 6 illustrates that the partition wall WL is arranged on the interlayer insulating layer 105 like the auxiliary line 240. For example, the partition wall WL may be located in a first opening 107OP like a portion of the auxiliary line 240. The partition wall WL may be arranged on both sides (e.g., the left side and the right side in FIG. 6) of the auxiliary line 240 or arranged adjacent to one side of the auxiliary line 240.

The partition wall WL may have a shape in which the lower width and the upper width are equal to each other in the cross-sectional view. However, the embodiment is not limited thereto. In another embodiment, the partition wall WL may have a shape in which the lower width and the upper width are different from each other in the cross-sectional view. For example, the upper width of the partition wall WL may be less than the lower width thereof. Hereinafter, for convenience of description, the partition wall WL will be described as having a shape in which the lower width and the upper width are equal to each other.

A planarization insulating layer 107 may be arranged on the connection electrode 230, the auxiliary line 240, and the driving voltage line 250. The planarization insulating layer 107 may include an organic insulating material such as acryl, benzocyclobutene (BCB), polyimide, and/or hexamethyldisiloxane (HMDSO).

The planarization insulating layer 107 may include the first opening 107OP that overlaps the auxiliary line 240. A first width W1 of the first opening 107OP may be greater than a second width W2 of the auxiliary line 240, and thus, the insulating layer thereunder, for example, a portion of the upper surface of the interlayer insulating layer 105, may be exposed through the first opening 107OP.

The first electrode 310 on the planarization insulating layer 107 may be electrically connected to the first subpixel circuit PC1 through a contact hole 107CNT. For example, as illustrated in FIG. 6, the first electrode 310 may be connected to the connection electrode 230 through the contact hole 107CNT.

The first electrode 310 may include a (semi) transparent electrode or a reflective electrode. In some embodiments, the first electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In some embodiments, the first electrode 310 may include a transparent or semitransparent electrode layer formed on the above reflective layer. The transparent or semitransparent electrode layer may include a transparent conductive oxide (TCO) such as an indium tin oxide (ITO), an indium zinc oxide (IZO), a zinc oxide (ZnO), an indium oxide ($In_2O_3$), an indium gallium oxide (IGO), and an aluminum zinc oxide (AZO). In some embodiments, the first electrode 310 may have a three-layer structure of ITO layer/Ag layer/ITO layer.

A bank layer 111 may be arranged on the first electrode 310 and may cover an edge of the first electrode 310. The bank layer 111 may include an opening (hereinafter referred to as an emission opening 111EOP) that overlaps a portion of the first electrode 310. The emission opening 111EOP may expose a center portion of the first electrode 310. The bank layer 111 may include an organic material. The bank layer 111 may include a second opening 111OP that overlaps the first opening 107OP of the planarization insulating layer 107. A third width W3 of the second opening 111OP may be greater than the first width W1 of the first opening 107OP.

An intermediate layer 320 may contact the first electrode 310 through the emission opening 111EOP. The intermediate layer 320 may be a layer including an organic material and may include an emission layer.

A second electrode 330 may include a conductive material having a low work function. For example, the second electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the second electrode 330 may further include a layer such as ITO, IZO, ZnO, or $In_2O_3$ on the (semi) transparent layer including the above material.

The light emitting diode including a multilayer structure of the first electrode 310, the intermediate layer 320, and the second electrode 330, for example, the first light emitting diode LED1, may be covered with an encapsulation layer 400. In an embodiment, the encapsulation layer 400 may include a first inorganic encapsulation layer 410, an organic encapsulation layer 420 on the first inorganic encapsulation layer 410, and a second inorganic encapsulation layer 430 on the organic encapsulation layer 420. The first and second inorganic encapsulation layers 410 and 430 may each include one or more inorganic insulating materials. The inorganic insulating material may include aluminum oxide, tantalum oxide, hafnium oxide, zinc oxide, silicon oxide, silicon nitride, and/or silicon oxynitride.

The first and second inorganic encapsulation layers 410 and 430 may be formed through chemical vapor deposition. Because the first inorganic encapsulation layer 410 has relatively excellent step coverage, it may completely cover the auxiliary line 240 and the partition wall WL despite the shape of the auxiliary line 240 and the partition wall WL.

The organic encapsulation layer 420 may include a polymer-based material. The polymer-based material may include acryl-based resin, epoxy-based resin, polyimide, polyethylene, and the like. The acryl-based resin may include, for example, polymethyl methacrylate, polyacrylic acid, or the like.

A color conversion-transmission layer 500 and a color layer 600 may be arranged on the encapsulation layer 400. In this regard, FIG. 6 illustrates that a first color conversion unit 510 of the color conversion-transmission layer 500 may be arranged to overlap the first light emitting diode LED1 and a first color filter 610 of the color layer 600 may be arranged to overlap the first light emitting diode LED1. The first color conversion unit 510 and the first color filter 610 may be surrounded by shading portions 540 and 640 respectively, and in this regard, FIG. 6 illustrates the shading portions 540 and 640 arranged on both sides of the first color conversion unit 510 and the first color filter 610 respectively. The shading portions 540 and 640 may include a shading material such as a black matrix, and the auxiliary line 240 may overlap the shading portions 540 and 640.

The second electrode 330 may be electrically connected to the auxiliary line 240 in the display area DA. Particularly, at least a portion of the second electrode 330 may directly contact the auxiliary line 240.

The intermediate layer 320 and the second electrode 330 may be deposited by using a mask having an opening corresponding to the display area DA, and a portion of the intermediate layer 320 may be disconnected or separated around a tip T due to the shape of the auxiliary line 240 having a protruding tip (T) structure. Because the intermediate layer 320 formed under the second electrode 330 includes portions disconnected by the tip T, a portion of the second electrode 330 may directly contact the auxiliary line 240. When the partition wall WL is arranged around the auxiliary line 240, because the deposition of the intermediate layer 320 is restricted by the partition wall WL, the contact area between the second electrode 330 and the auxiliary line 240 formed on the intermediate layer 320 may be increased. The structure of the intermediate layer 320 and the second electrode 330 around the partition wall WL and the auxiliary line 240 will be described in detail with reference to FIGS. 7 to 9.

Figure 7:
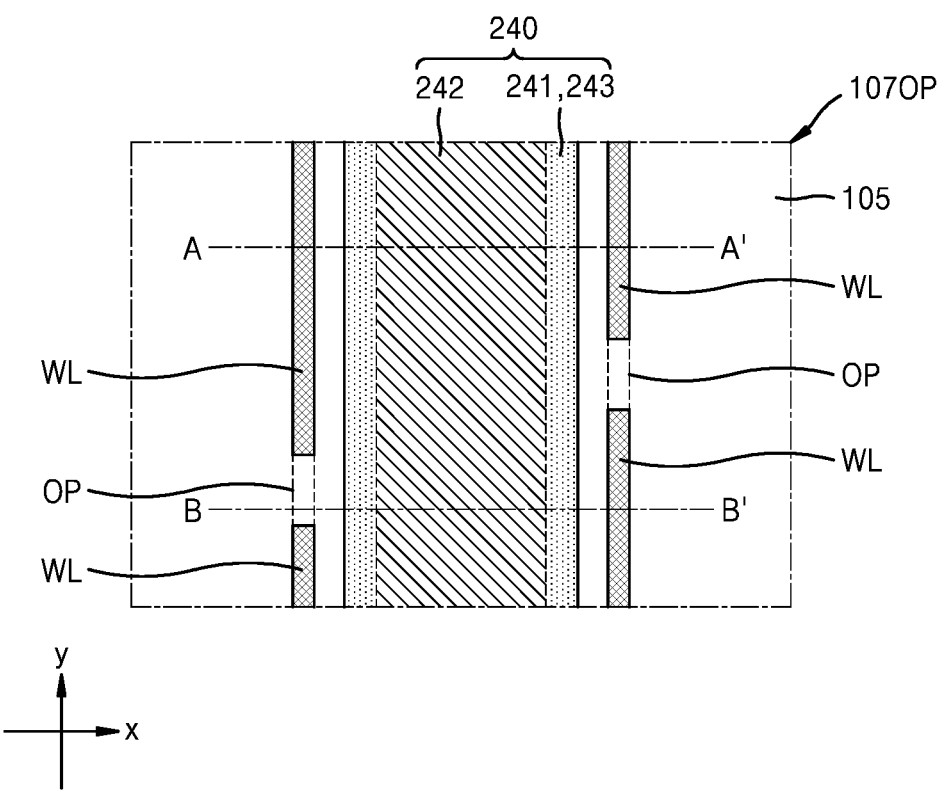
FIG. 7 is a plan view schematically illustrating an auxiliary line and a partition wall adjacent to the auxiliary line, according to an embodiment.
Figure 8:
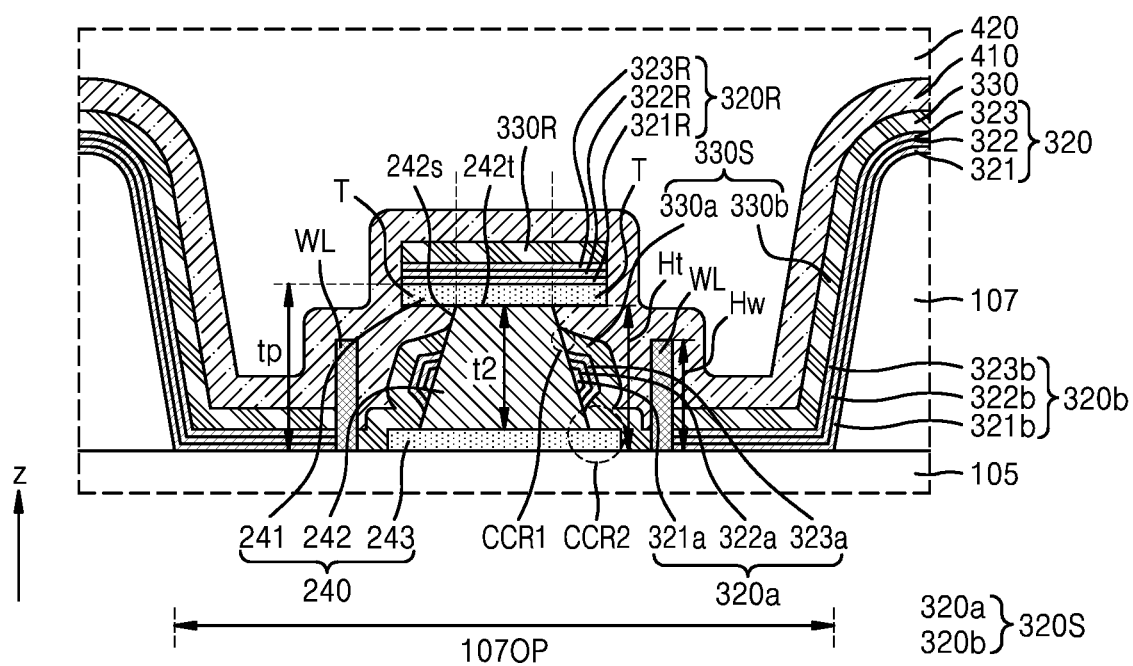
FIG. 8 is a cross-sectional view of the auxiliary line and the partition wall taken along line A-A' of FIG. 7.
Figure 9:
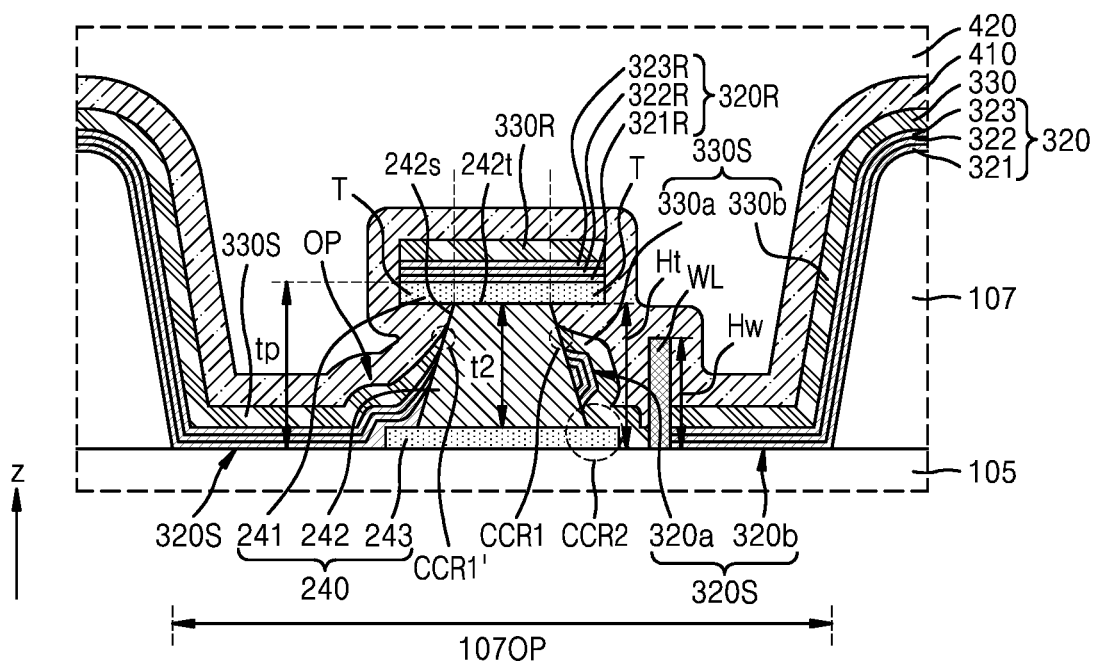
FIG. 9 is a cross-sectional view of the auxiliary line and the partition wall taken along line B-B' of FIG. 7.

FIG. 7 is a plan view schematically illustrating an auxiliary line and a partition wall adjacent to the auxiliary line, according to an embodiment, FIG. 8 is a cross-sectional view of the auxiliary line and the partition wall taken along line A-A' of FIG. 7, and FIG. 9 is a cross-sectional view of the auxiliary line and the partition wall taken along line B-B' of FIG. 7. FIG. 7 may correspond to a top plan view of the auxiliary line illustrated in FIG. 6.

Referring to FIG. 7, a partition wall WL may be arranged adjacent to the auxiliary line 240. As described above, the partition wall WL may be located in the first opening 107OP of the planarization insulating layer 107 (FIG. 6). The partition wall WL may be arranged along at least one of both sides of the auxiliary line 240 in the plan view, and FIG. 7 illustrates that the partition wall WL is arranged on each of both sides of the auxiliary line 240. The width of the first opening 107OP of the planarization insulating layer 107 may be greater than the sum of the width (the width in the x direction) of the auxiliary line 240 and the width of the partition wall(s) WL arranged around the auxiliary line 240.

The partition wall WL may have at least one opening OP corresponding to the side surface of the auxiliary line 240. The at least one opening OP may be located in the first opening 107OP of the planarization insulating layer 107 (FIG. 6).

As illustrated in FIG. 7, when the partition wall WL is arranged on each of both sides of the auxiliary line 240, the opening OP of the partition wall WL and the opening OP of the other partition wall WL may be located to be horizontally asymmetrical with respect to the auxiliary line 240. For example, in the cross-sectional view taken along line B-B' of FIG. 7 intersecting with the longitudinal direction (the y direction) of the auxiliary line 240, the opening OP of the partition wall WL located on the left side of the auxiliary line 240 may correspond to a barrier portion of the partition wall WL located on the right side of the auxiliary line 240 (here, the barrier portion may be a portion of the body of the partition wall WL, which is not an opening, and may represent a material portion including a material corresponding to the partition wall WL). Similarly, the opening OP of the partition wall WL located on the right side of the auxiliary line 240 may correspond to a barrier portion of the partition wall WL located on the left side of the auxiliary line 240 (here, the barrier portion may be a portion of the body of the partition wall WL, which is not an opening, and may represent a material portion including a material corresponding to the partition wall WL).

Referring to FIGS. 7 and 8, the second electrode 330 formed on the auxiliary line 240 may be separated or disconnected by the partition wall WL, for example, the barrier portion of the partition wall WL. As illustrated in FIG. 8, the second electrode 330 may include a portion (hereinafter referred to as a first portion 330a (see FIG. 8)) arranged on one side of the partition wall WL and connected to the auxiliary line 240 and a portion (hereinafter referred to as a second portion 330b (see FIG. 8)) opposite to the first portion 330a with the partition wall WL therebetween. Because the first portion 330a and the second portion 330b of the second electrode 330 are separated or disconnected from each other around the partition wall WL but are integrally connected to each other through the opening OP as illustrated in FIG. 9, the common voltage supplied through the auxiliary line 240 may be transmitted to the second electrode 330 of the organic light emitting diode through an electrical path passing through the opening OP.

The auxiliary line 240 may have a multilayer structure as illustrated in FIGS. 8 and 9. The auxiliary line 240 may include a main sublayer 242 and an upper sublayer 241 arranged over the main sublayer 242 and a lower sublayer 243 arranged under the main sublayer 242. Referring to FIG. 8, the main sublayer 242 of the auxiliary line 240 may be a sublayer occupying most of the auxiliary line 240. The fact that the main sublayer 242 occupies most of the auxiliary line 240 may mean that a thickness t2 of the main sublayer 242 is about 50% or more of a total thickness tp of the auxiliary line 240 with respect to a center portion thereof. In some embodiments, the thickness t2 of the main sublayer 242 may be about 60% or more or about 70% or more of the total thickness tp of the auxiliary line 240 with respect to the center portion. The thickness t2 of the main sublayer 242 may be greater than the thickness of each of the upper sublayer 241 and the lower sublayer 243. In an embodiment, the main sublayer 242 may have a thickness of about 1,000 Å to about 15,000 Å.

The width of the upper sublayer 241 may be greater than the width of an upper surface 242t of the main sublayer 242. In other words, in the cross-sectional view, the upper sublayer 241 may include a tip T protruding in the lateral direction from a point where a side surface 242s and the upper surface 242t of the main sublayer 242 meet each other.

The width of the lower sublayer 243 may be greater than the width of the lower surface of the main sublayer 242. In other words, in the cross-sectional view, the lower sublayer 243 may include a tip protruding in the lateral direction from a point where the side surface 242s and the lower surface of the main sublayer 242 meet each other.

The tip T of the auxiliary line 240 may be formed by etching a portion of the auxiliary line 240 exposed through the first opening 107OP after forming the auxiliary line 240 on the interlayer insulating layer 105 and forming the planarization insulating layer 107 having the first opening 107OP. The etching process may be a wet etching process using an etchant. The auxiliary line 240 may be etched simultaneously with an etching process of forming the first electrode 310 (see FIG. 6) on the planarization insulating layer 107. For example, in the etching process of forming the first electrode 310 (see FIG. 6), a portion of the auxiliary line 240 exposed through the first opening 107OP may be etched and a structure of the auxiliary line 240 having the tip T may be formed.

The material of the main sublayer 242 of the auxiliary line 240 may include a material having a different etch selectivity than the material of the upper sublayer 241. Similarly, the material of the lower sublayer 243 may also include a material having a different etch selectivity than the material of the main sublayer 242, and in some embodiments, the lower sublayer 243 may include the same material as the upper sublayer 241. Because the main sublayer 242 is over-etched than the upper sublayer 241 by the etchant used in the etching process, the tip T described above may be formed in the upper sublayer 241.

The partition wall WL may be formed by a process separate from the process of etching a portion of the auxiliary line 240 described above. For example, the partition wall WL may be deposited by using a separate mask after forming the auxiliary line 240 having the tip (T) structure described above. The partition wall WL may include a non-conductive organic material and/or an inorganic material, depending on the material used in the deposition. For example, the partition wall WL may include at least one of polyimide, acryl, and siloxane.

The upper end of the partition wall WL may be spaced apart from the tip T of the auxiliary line 240. The upper end of the partition wall WL may be spaced apart from the tip T of the upper sublayer 241 in the x direction and the z direction. Because the upper end of the partition wall WL is spaced apart from the tip T of the auxiliary line 240, a path through which the second electrode 330 may be deposited may be secured as a space between the auxiliary line 240 and the partition wall WL. The lower end of the partition wall WL may be spaced apart from the end portion (the end portion in the x direction) of the lower sublayer 243 or may directly contact the end portion of the lower sublayer 243.

A thickness Hw of the partition wall WL may be equal to or less than about 0.75 times a thickness Ht of the auxiliary line 240. Here, the thickness Ht of the auxiliary line 240 may represent the total thickness including all of the lower sublayer 243, the main sublayer 242, and the upper sublayer 241. When the thickness Hw of the partition wall WL is greater than about 0.75 times the thickness Ht of the auxiliary line 240, because it is difficult to deposit the second electrode 330 into the space between the auxiliary line 240 and the partition wall WL, an electrical connection (e.g., a contact) between the second electrode 330 and the auxiliary line 240 may not be formed.

In some embodiments, the thickness Hw of the partition wall WL may be equal to or less than about 0.7 times and may be equal to or greater than about 0.5 times the thickness Ht of the auxiliary line 240 (Ht×0.5≤Hw≤Ht×0.7). When the thickness Hw of the partition wall WL is less than about 0.5 times the thickness Ht of the auxiliary line 240, the intermediate layer 320 may not be disconnected or separated by the partition wall WL despite the presence of the partition wall WL.

In some embodiments, the thickness Hw of the partition wall WL may be equal to or less than about 0.65 times and may be equal to or greater than about 0.5 times the thickness Ht of the auxiliary line 240. In some embodiments, the thickness Hw of the partition wall WL may be equal to or less than about 0.75 times and may be equal to or greater than about 0.45 times the thickness Ht of the auxiliary line 240. In some embodiments, the thickness Hw of the partition wall WL may be equal to or less than about 0.7 times and may be equal to or greater than about 0.45 times the thickness Ht of the auxiliary line 240. In some embodiments, the thickness Hw of the partition wall WL may be equal to or less than about 0.65 times and may be equal to or greater than about 0.45 times the thickness Ht of the auxiliary line 240.

The intermediate layer 320 may include an emission layer 322 and may include a functional layer located under and/or over the emission layer 322. In this regard, FIG. 8 illustrates that the intermediate layer 320 includes an emission layer 322, a first functional layer 321 arranged under the emission layer 322, and a second functional layer 323 arranged over the emission layer 322.

The intermediate layer 320 may be formed by deposition. For example, the deposition process may be thermal evaporation. In the deposition process, the material constituting the intermediate layer 320 may propagate in a direction (the z direction) perpendicular to the substrate 100 (see FIG. 6) and in a direction oblique thereto. For example, the intermediate layer 320 may be deposited in a direction having a certain incident angle with respect to the z direction.

In this case, an area in which the intermediate layer 320 is not deposited (hereinafter referred to as a deposition restriction area) may be generated by the partition wall WL and the eaves structure in which the auxiliary line 240 has a tip T on both sides.

The intermediate layer 320 may be disconnected or separated around the auxiliary line 240 by the tip (T) structure of the auxiliary line 240. A portion 320R of the intermediate layer 320, for example, a portion 321R of the first functional layer, a portion 322R of the emission layer, and a portion 323R of the second functional layer may be formed on the upper surface of the upper sublayer 241. Another portion 320S of the intermediate layer 320 may be formed on at least one side of the auxiliary line 240, and FIGS. 8 and 9 illustrate that the other portion 320S is formed on both sides of the auxiliary line 240.

The other portion 320S of the intermediate layer 320 may be disconnected or separated around the partition wall WL as illustrated in FIGS. 8 and 9. The other portion 320S of the intermediate layer 320 may include a first portion 320a arranged on the side of the auxiliary line 240 around the partition wall WL and a second portion 320b located opposite the first portion 320a with the partition wall WL therebetween.

The first portion 320a may include a first portion 321a of the first functional layer, a first portion 322a of the emission layer, and a first portion 323a of the second functional layer. The second portion 320b may include a second portion 321b of the first functional layer, a first portion 322*b* of the emission layer, and a first portion 323*b* of the second functional layer. The first portion 320*a* of the intermediate layer 320 may directly contact the auxiliary line 240, for example, the side surface 242*s* of the main sublayer 242.

The other portion 320S of the intermediate layer 320 may not be disconnected or separated in the opening OP of the partition wall WL as illustrated in FIG. 9. Referring to the left portion of the auxiliary line 240 illustrated in FIG. 9, the other portion 320S of the intermediate layer 320 may be continuously formed without being disconnected or separated.

Referring to FIGS. 8 and 9, the first portion 320*a* and the second portion 320*b* of the intermediate layer 320 may be separated from each other around the partition wall WL but may be integrally connected to each other through the opening OP.

Like the intermediate layer 320, the second electrode 330 may be deposited in a direction perpendicular to the substrate 100 (see FIG. 6) (the z direction) and in a direction oblique thereto. For example, the second electrode 330 may be deposited in a direction having a certain incident angle with respect to the z direction. An area in which the second electrode 330 is not deposited (hereinafter referred to as a deposition restriction area) may be generated by the partition wall WL and the eaves structure in which the auxiliary line 240 has a tip T.

The second electrode 330 may be deposited by sputtering. In some embodiments, the second electrode 330 may be deposited by thermal evaporation or sputtering. When the second electrode 330 is deposited by sputtering, because the degree of freedom of deposited particles is relatively high compared to thermal deposition, the deposition restriction area in which the deposition of the second electrode 330 is restricted by the partition wall WL and the eaves structure of the tip T may be reduced. That is, the contact area between the second electrode 330 and the auxiliary line 240 may be formed to be wider.

The second electrode 330 may be disconnected or separated around the auxiliary line 240 by the tip (T) structure of the auxiliary line 240. A portion 330R of the second electrode 330 may be formed on the upper surface of the upper sublayer 241. Another portion 330S of the second electrode 330 may be formed on at least one side of the auxiliary line 240, and FIGS. 8 and 9 illustrate that the other portion 330S is formed on both sides of the auxiliary line 240.

The other portion 330S of the second electrode 330 may be disconnected or separated around the partition wall WL as illustrated in FIGS. 8 and 9. The other portion 330S of the second electrode 330 may include a first portion 330*a* arranged on the side of the auxiliary line 240 around the partition wall WL and a second portion 330*b* located opposite the first portion 330*a* with the partition wall WL therebetween. The first portion 330*a* of the second electrode 330 may directly contact the auxiliary line 240. For example, the first portion 330*a* of the second electrode 330 may directly contact the side surface 242*s* of the main sublayer 242 and/or the upper surface of the lower sublayer 243.

As illustrated in FIGS. 8 and 9, the first portion 330*a* of the second electrode 330 may contact the side surface 242*s* of the main sublayer 242 to form a first contact area CCR1. The first contact area CCR1 may be located above the first portion 320*a* of the intermediate layer 320 in the z direction. The first portion 330*a* of the second electrode 330 may contact the side surface 242*s* of the main sublayer 242 below the first portion 320*a* of the intermediate layer 320 in the z direction and may contact the upper surface of the lower sublayer 243 to form a second contact area CCR2.

The other portion 330S of the second electrode 330 may not be disconnected or separated in the opening OP of the partition wall WL as illustrated in FIG. 9. Referring to the left area of the auxiliary line 240 illustrated in FIG. 9, the other portion 330S of the second electrode 330 may be continuously formed without being disconnected or separated.

Referring to FIGS. 8 and 9, the first portion 330*a* and the second portion 330*b* of the second electrode 330 may be separated from each other around the partition wall WL but may be integrally connected to each other through the opening OP.

As illustrated in FIG. 9, because the deposition of the intermediate layer 320 is not restricted in the opening OP of the partition wall WL, the contact area between the second electrode 330 and the auxiliary line 240 may be reduced. In the opening OP of the partition wall WL, the other portion 320S of the intermediate layer 320 may cover a lower insulating layer, for example, a portion of the upper surface of the interlayer insulating layer 105 and the upper surface of the lower sublayer 243. However, as illustrated in FIGS. 8 and 9, because the other portion 320S of the intermediate layer 320 includes the first portion 320*a* and the second portion 320*b* spaced apart from each other around the partition wall WL, a portion of the upper surface of the lower sublayer 243 may be exposed without being covered by the intermediate layer 320 and the second electrode 330 formed on the intermediate layer 320 may directly contact a portion of the upper surface of the lower sublayer 243 to form the second contact area CCR2. The contact area between the second electrode 330 and the auxiliary line 240 may further increase by the second contact area CCR2. Thus, the contact resistance between the second electrode 330 and the auxiliary line 240 may decrease.

On the other hand, a first contact area CCR1' in which the second electrode 330 and the auxiliary line 240 (e.g., a side surface 241*s* of the main sublayer 241) directly contact each other may be formed around the opening OP, but an area corresponding to the second contact area CCR2 described above may not be formed in the opening OP. As illustrated in FIGS. 8 and 9, only the first contact area CCR1' may be formed around the opening OP, whereas the first contact area CCR1 and the second contact area CCR2 may be formed around the partition wall WL. The contact area between the second electrode 330 and the auxiliary line 240 around the partition wall WL may be greater than the contact area between the second electrode 330 and the auxiliary line 240 in the opening OP.

The first contact area CCR1' between the second electrode 330 and the auxiliary line 240 in the opening OP may have substantially the same area as the first contact area CCR1 between the second electrode 330 and the auxiliary line 240 around the partition wall WL. Alternatively, the first contact area CCR1' between the second electrode 330 and the auxiliary line 240 in the opening OP may be smaller than the first contact area CCR1 between the second electrode 330 and the auxiliary line 240 around the partition wall WL.

According to an embodiment, it may be possible to provide a display apparatus having an improved display quality by improving a voltage drop according to line resistance difference of a first electrode connected to an auxiliary line and a second electrode connected to the auxiliary line by way of a diode that has a voltage drop associated therewith. However, the embodiments described herein are not limited to these effects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
an auxiliary line that includes a main sublayer, a lower sublayer arranged under the main sublayer, and an upper sublayer arranged over the main sublayer;
a partition wall adjacent to the auxiliary line and that includes an opening corresponding to a side surface of the auxiliary line;
a first electrode adjacent to the auxiliary line;
a second electrode arranged over the first electrode and the auxiliary line; and
an intermediate layer arranged between the first electrode and the second electrode and that includes an emission layer; and
a first insulating layer that includes an opening having a greater width than the auxiliary line,
wherein the upper sublayer of the auxiliary line includes a tip protruding in a lateral direction from a point where a side surface and an upper surface of the main sublayer meet each other,
an upper end of the partition wall is spaced apart from the tip of the auxiliary line,
the second electrode contacts the auxiliary line and the partition wall, and
a portion of the auxiliary line and the partition wall are located in the opening of the first insulating layer.

2. The display apparatus of claim 1, wherein a thickness of the partition wall is equal to or less than 0.75 times a thickness of the auxiliary line.

3. The display apparatus of claim 1, wherein
the second electrode includes a first portion that contacts the auxiliary line and a second portion located opposite the first portion with respect to the partition wall,
the first portion and the second portion are separated from each other around the partition wall and integrally connected to each other through the opening of the partition wall, and
the first portion of the second electrode contacts the side surface of the main sublayer to form a first contact area, and
the first contact area is located above the intermediate layer in a thickness direction.

4. The display apparatus of claim 1, wherein the second electrode directly contacts at least one of a side surface of the main sublayer of the auxiliary line and an upper surface of the lower sublayer of the auxiliary line.

5. The display apparatus of claim 1, wherein a thickness of the main sublayer is greater than at least one of a thickness of the upper sublayer and a thickness of the lower sublayer.

6. The display apparatus of claim 1, wherein the main sublayer includes at least one of copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

7. The display apparatus of claim 1, wherein at least one of the upper sublayer and the lower sublayer includes at least one of indium tin oxide (ITO), titanium (Ti), molybdenum (Mo), and tungsten (W).

8. The display apparatus of claim 1, wherein
the intermediate layer is arranged over the first electrode and the auxiliary line, and
the intermediate layer includes:
a first portion on an upper surface of the auxiliary line;
a second portion arranged on a side of the auxiliary line with respect to the partition wall; and
a third portion located opposite the second portion with respect to the partition wall.

9. The display apparatus of claim 8, wherein the first portion and the second portion of the intermediate layer are separated from each other around the partition wall and integrally connected to each other through the opening of the partition wall.

10. A display apparatus comprising:
an auxiliary line that includes a main sublayer, a lower sublayer arranged under the main sublayer, and an upper sublayer arranged over the main sublayer;
an insulating layer arranged over the auxiliary line and that includes a first opening that overlaps the auxiliary line;
a partition wall arranged on one side of the auxiliary line and that includes an opening;
a first electrode arranged over the insulating layer and adjacent to the auxiliary line;
a second electrode arranged over the first electrode and the auxiliary line; and
an intermediate layer arranged between the first electrode and the second electrode and including an emission layer,
wherein the upper sublayer of the auxiliary line includes a tip protruding in a lateral direction from a point where a side surface and an upper surface of the main sublayer meet each other,
an upper end of the partition wall is spaced apart from the tip of the auxiliary line,
the second electrode contacts the auxiliary line and the partition wall, and
a width of the first opening of the insulating layer is greater than a sum of a width of the auxiliary line and a width of the partition wall.

11. The display apparatus of claim 10, wherein the partition wall is located in the first opening of the insulating layer.

12. The display apparatus of claim 10, further comprising an additional partition wall arranged on another side of the auxiliary line and including an opening.

13. The display apparatus of claim 12, wherein the opening of the additional partition wall and the opening of the partition wall are respectively located on both sides of the auxiliary line and are asymmetrically arranged with respect to the auxiliary line.

14. The display apparatus of claim 10, wherein a thickness of the partition wall is equal to or less than 0.75 times a thickness of the auxiliary line.

15. The display apparatus of claim 10, wherein
the second electrode includes a first portion that contacts the auxiliary line and a second portion located opposite the first portion with respect to the partition wall,
the first portion and the second portion are separated from each other around the partition wall and integrally connected to each other through the opening of the partition wall, and
the first portion of the second electrode contacts the side surface of the main sublayer to form a first contact area, and the first contact area is located above the intermediate layer in a thickness direction.

16. The display apparatus of claim 10, wherein the second electrode directly contacts at least one of a side surface of the main sublayer of the auxiliary line and an upper surface of the lower sublayer of the auxiliary line.

17. The display apparatus of claim 10, wherein a thickness of the main sublayer is greater than at least one of a thickness of the upper sublayer and a thickness of the lower sublayer.

18. The display apparatus of claim 10, wherein the main sublayer includes a different material than the upper sublayer and the lower sublayer.

\* \* \* \* \*